(12) United States Patent
Liu et al.

(10) Patent No.: US 7,385,830 B2
(45) Date of Patent: Jun. 10, 2008

(54) MOUNTING APPARATUS FOR PRINTED CIRCUIT BOARD

(75) Inventors: Chien-Chung Liu, Tu-Cheng (TW); Chen-Lu Fan, Tu-Cheng (TW); Li-Ping Chen, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 189 days.

(21) Appl. No.: 11/193,880

(22) Filed: Jul. 29, 2005

(65) Prior Publication Data
US 2006/0114662 A1 Jun. 1, 2006

(30) Foreign Application Priority Data
Nov. 30, 2004 (CN) .................. 2004 2 0102256 U

(51) Int. Cl.
*H05K 7/02* (2006.01)
(52) U.S. Cl. .................. 361/810; 174/138 R
(58) Field of Classification Search ............ 361/742, 361/770, 804; 174/138 R; 439/92, 95
See application file for complete search history.

(56) References Cited

U.S. PATENT DOCUMENTS

| | | | | |
|---|---|---|---|---|
| 6,385,051 B1 | 5/2002 | Perez et al. | ............ | 361/759 |
| 6,695,629 B1 * | 2/2004 | Mayer | ............ | 439/92 |
| 7,028,389 B2 * | 4/2006 | Chang | ............ | 29/739 |
| 2002/0181219 A1 * | 12/2002 | Paquin et al. | ............ | 361/809 |
| 2004/0235322 A1 * | 11/2004 | Hooper | ............ | 439/95 |

FOREIGN PATENT DOCUMENTS

| | | |
|---|---|---|
| CN | 00201452.1 | 12/2000 |
| CN | 00231300.1 | 5/2003 |

* cited by examiner

Primary Examiner—Diego F. F. Gutierrez
Assistant Examiner—Yuriy Semenenko
(74) Attorney, Agent, or Firm—Morris Manning Martin LLP; Tim Tiangkang Xia, Esq.

(57) ABSTRACT

A mounting apparatus used to fasten a PCB (10) with through holes (12) includes a supporting board (20) and a plurality of clips (30) mounted on the PCB. The supporting board has a plurality of standoffs (22) corresponding to the through holes of the PCB. Each of the clips includes a resilient portion (34) and defines a mounting opening (35) for having the standoffs sliding therein. When the standoffs press on the resilient portions of the clips, the PCB is clamped on the supporting board.

8 Claims, 6 Drawing Sheets

MOUNTING APPARATUS FOR PRINTED CIRCUIT BOARD

BACKGROUND OF THE INVENTION

1. Field of the Invention

The present invention relates to mounting apparatuses for printed circuit boards (PCBs), and particularly to a mounting apparatus for a PCB of a computer or server.

2. Background of the Invention

A PCB of a computer, such as a motherboard, is usually mounted to the computer by screws as described in China Patent No. 00201452.1. A plurality of protrusions is arranged on a bottom panel of the computer. Each of the protrusions defines a hole therein. In assembly, a plurality of screws is mounted into holes defined in the PCB and the corresponding holes of the protrusions. The PCB is thus mounted in the computer. However, the mounting means described above is inefficient and cumbersome for a large number of screws are used.

Another mounting apparatus for a PCB is provided in China Patent No. 02231300.1. The mounting apparatus includes a locking member, a slide member and an elastic subassembly. The locking member defines a quadrate slot in an end portion thereof. A hook protrudes from a middle portion of the locking member. The slide member can move in one direction on a chassis of a computer and defines a positioning hole therein. The elastic subassembly is mounted between the chassis and the slide member. In assembly, the locking member is rotated so that the quadrate slot engages with an edge of the PCB. The hook of the locking member is received in the positioning hole of the slide member by the elastic subassembly. The PCB is thus mounted in the computer. In disassembly, the slide member is pushed to move on the chassis. The hook is drawn out of the positioning slot. The locking member is rotated and moves away from the PCB by the elastic subassembly. The PCB is thus taken out of the computer. The mounting apparatus described above is convenient to mount the PCB. However, the mounting apparatus has a complex structure that increases manufacturing cost.

What is needed, therefore, is a mounting apparatus convenient to fasten a printed circuit board (PCB) and has a simple structure.

SUMMARY

A mounting apparatus for securing a PCB with a plurality of through holes includes a supporting board and a plurality of clips mounted on the PCB. The supporting board has a plurality of standoffs corresponding to the through holes of the PCB. Each of the clips includes a resilient portion and defines a mounting opening for having the standoffs sliding therein. When the standoffs press on the resilient portions of the clips, the PCB is clamped on the supporting board.

Other advantages and novel features of the present invention will be drawn from the following detailed description of preferred embodiment with attached drawings, in which:

DETAIL DESCRIPTION OF PREFERRED EMBODIMENT

Figure 1:
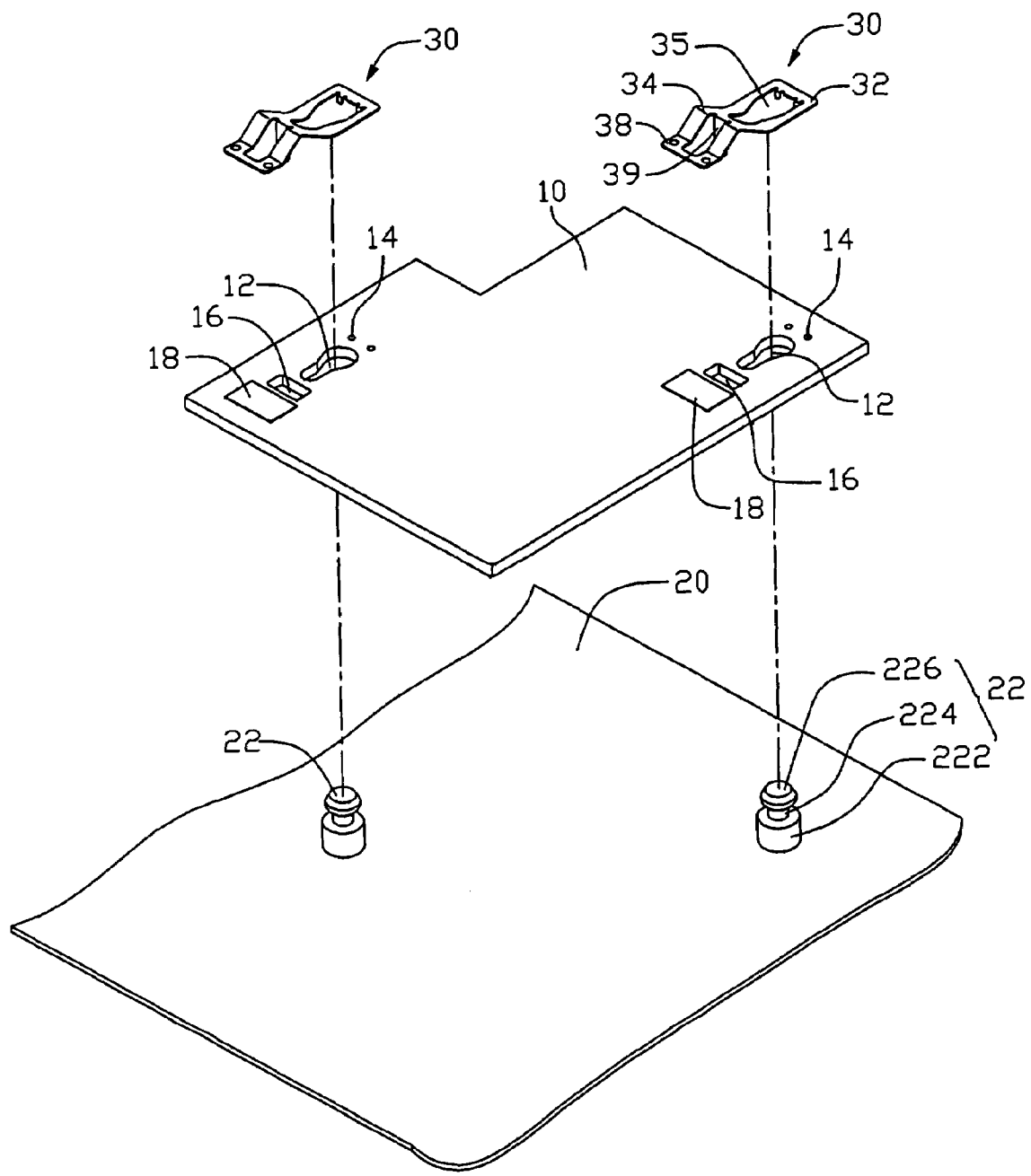
FIG. 1 is an exploded, isometric view of a mounting apparatus and a printed circuit board (PCB) in accordance with the preferred embodiment of the present invention, the mounting apparatus including a supporting board and a plurality of clips.
Figure 2:
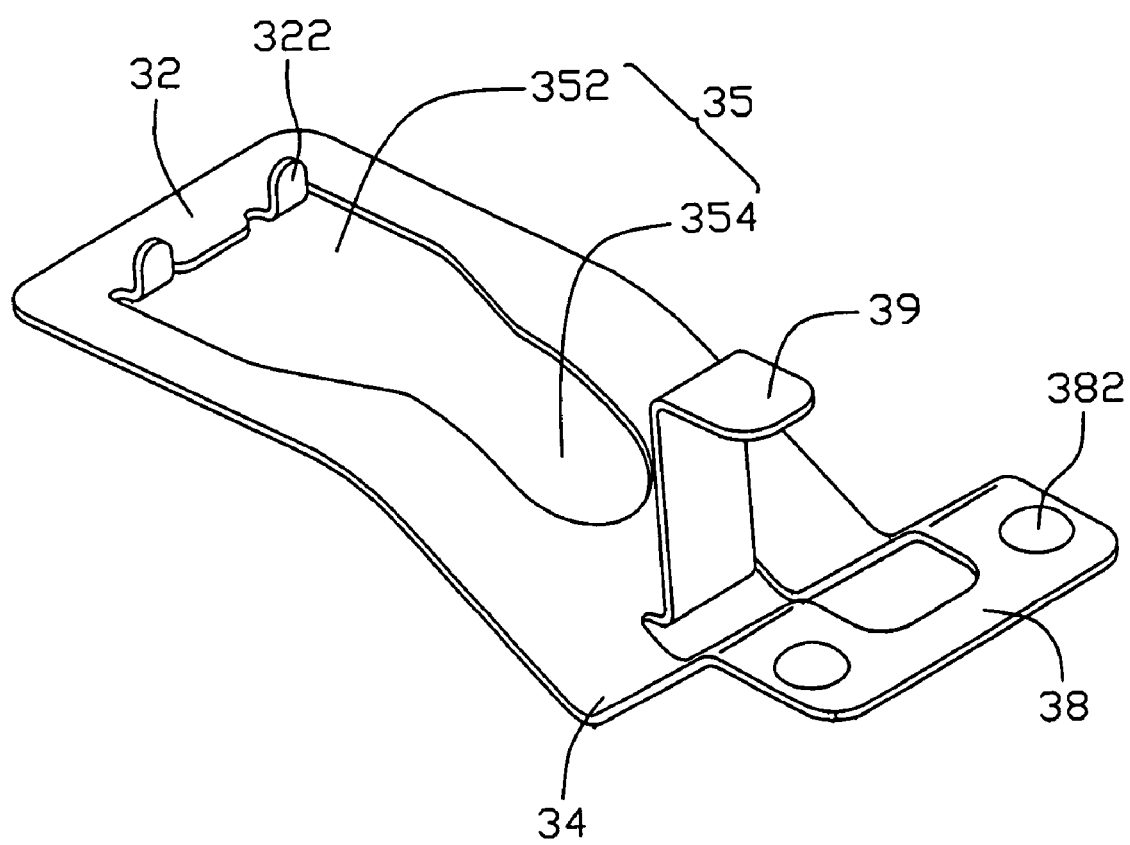
FIG. 2 is another isometric view of the clip of FIG. 1.

Referring to FIGS. 1 and 2, a mounting apparatus in accordance with the preferred embodiment of the present invention used to fasten a printed circuit board (PCB) 10 includes a supporting board 20 mounted to a chassis (not shown) and a plurality of clips 30.

The PCB 10 defines a plurality of through holes 12 therein. Two positioning holes 14 are defined in one side of each of the through hole 12, and a locking opening 16 is defined in the other side. A ground pad 18 is disposed on the PCB 10 adjacent to the locking opening 16.

The supporting board 20 has a plurality of standoffs 22 corresponding to the through hole 12. The standoff 22 includes a bottom portion 222, a head portion 226 and a neck portion 224 between the bottom portion 222 and the head portion 226. A diameter of the neck portion 224 is smaller than that of the bottom portion 222 and the head portion 226. The bottom portion 222 is used to support the PCB 10 and has a greater diameter than that of the through hole 12 of the PCB 10. The neck portion 224 can slide in the through hole 12, and the head portion 226 can pass through the through hole 12.

The clip 30 includes a mounting portion 32, a deformable resilient portion 34 and an extending portion 38 extending horizontally from an end of the resilient portion 34. The resilient portion 34 protrudes from the clip 30 in a substantially V-shape between the mounting portion 32 and the extending portion 38. A mounting opening 35 is defined in the mounting portion 32 of the clip 30 and extends into the resilient portion 34. The mounting opening 35 has a guiding opening 352 and a securing opening 354 disposed in the resilient portion 34. The neck portion 224 of the standoff 22 can slide in the mounting opening 35. The head portion 226 of the standoff 22 can pass through the guiding opening 352 and be positioned by the securing opening 354. A pair of tabs 322, corresponding to the positioning holes 14 of the PCB 10, protrudes from an edge of the mounting opening 35. An L-shaped positioning portion 39 corresponding to the locking opening 16 of the PCB 10 is formed downwardly from the resilient portion 34. A pair of protrusions 382 is formed on the extending portion 38 by stamping.

Figure 3:
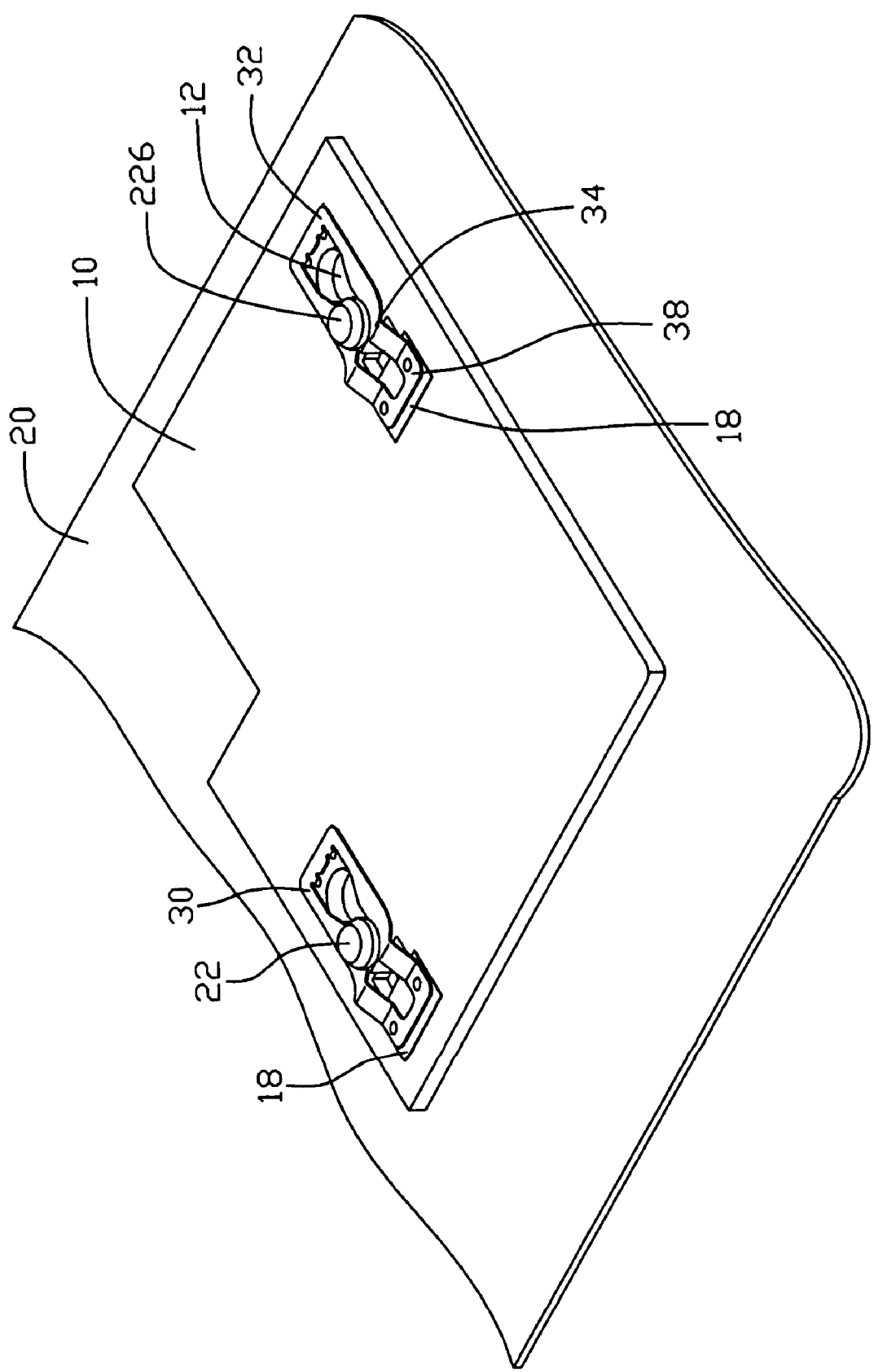
FIG. 3 is an assembled view of FIG. 1, showing the PCB in a locking position.
Figure 4:
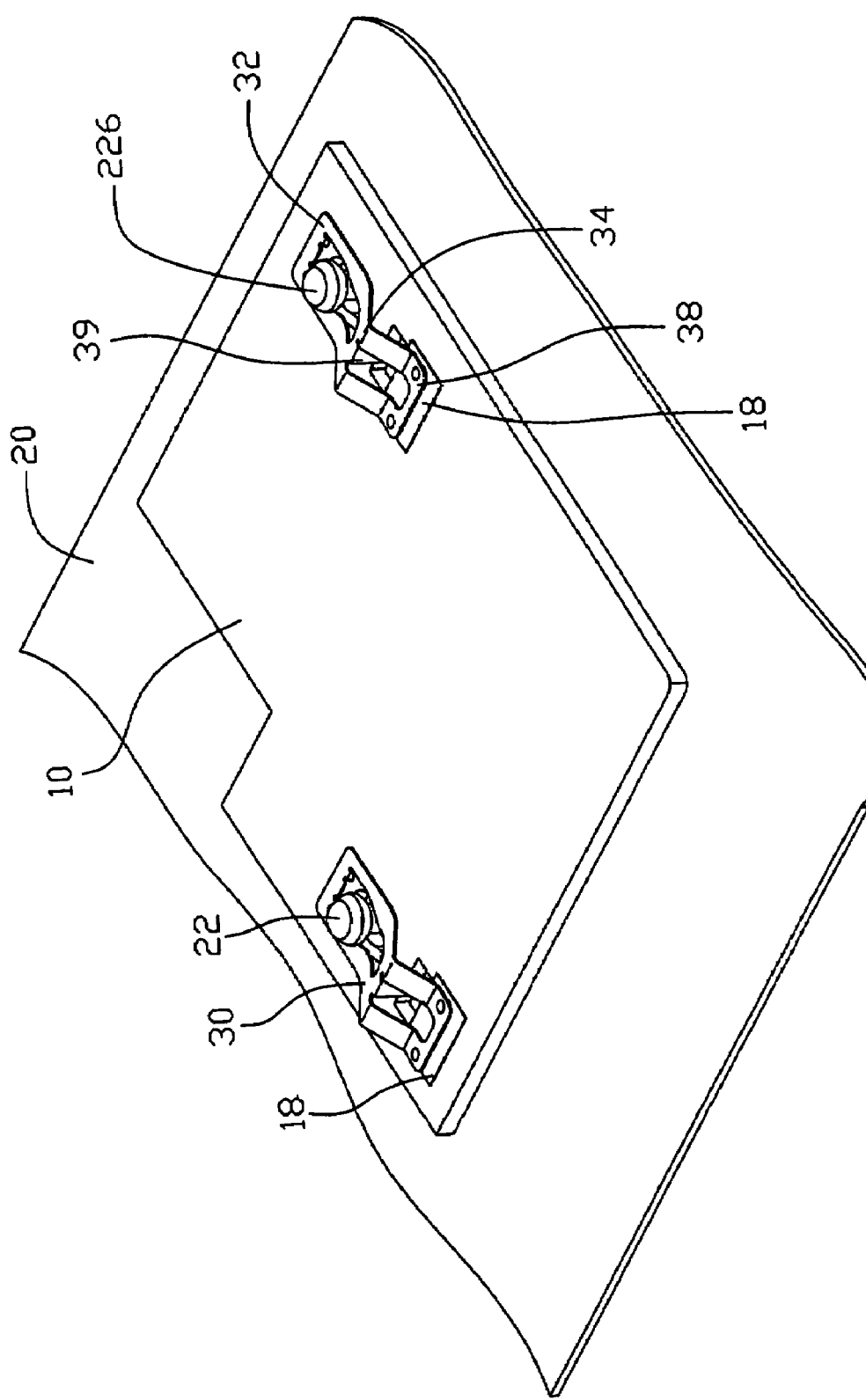
FIG. 4 is similar to FIG. 3, but showing the PCB in an unlocking position.

Referring also to FIGS. 3 and 4, in assembly, the clips 30 are mounted to the PCB 10 firstly. The positioning portion 39 of the clip 30 is inserted into the locking opening 16 of the PCB 10. The tabs 322 of the clip 30 are received in the corresponding positioning holes 14. The mounting portion 32 and the extending portion 38 abut on the PCB 10. The positioning portion 39 and the tabs 322 clamp the PCB 10, and the clip 30 is thus disposed on the PCB 10.

Then the PCB 10 altogether with the clips 30 are mounted to the supporting board 20. The head portion 226 and the neck portion 224 of the standoff 22 pass through the corresponding through hole 12 of the PCB 10. The head portion 226 further passes through the guiding opening 352 of the clip 30. The PCB 10 is supported on the bottom portion 222. Pushing the PCB 10 along the supporting board 20, the standoff 22 slides from the mounting portion 32 to the resilient portion 34 of the clip 34. When the neck portion 224 slides into the securing opening 354, the resilient portion 34 is deformed by the head portion 226 and pressed elastically and downwardly thereunder. The extending portion 38 extends horizontally, and the protrusions 382 touch the ground pad 18. The clip 30 is situated between the PCB 10 and the head portion 226 of the standoff 22. The PCB 10 is thus clamped on the supporting board 20 under the elastic force of the clips 30.

In disassembly, the PCB 10 is pushed reversely along the supporting board 20. When the neck portion 224 of the standoff 22 slides into the guiding opening 352, the head portion 226 of the standoff 22 is disengaged with the securing opening 354 of the clip 30. The clip 30 is released, and the PCB 10 is ready to be lifted from the supporting board 20 of the chassis.

Figure 5:
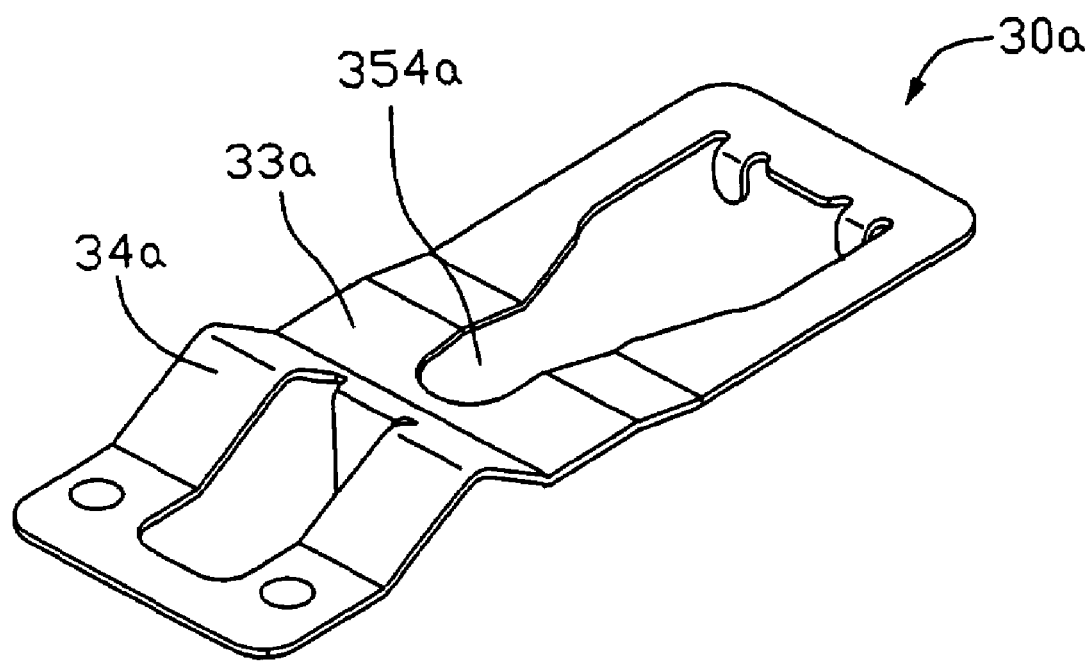
FIG. 5 is an isometric view of the clip of an alternative embodiment of the present invention.
Figure 6:
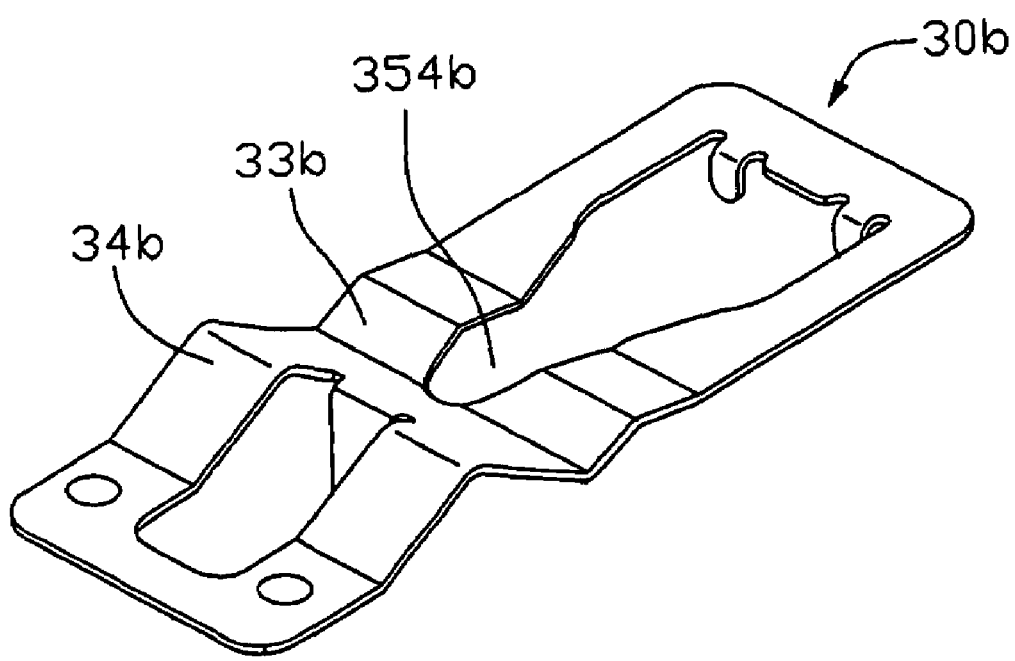
FIG. 6 is an isometric view of the clip of another alternative embodiment of the present invention.
Figure 7:
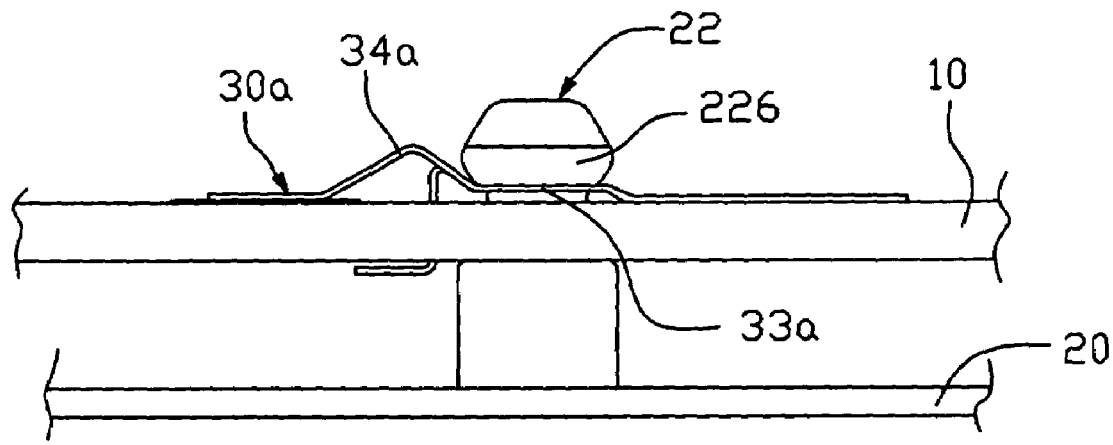
FIG. 7 is a side view of FIG. 3, but the clip of FIG. 1 being replaced by the clip of FIG. 5.
Figure 8:
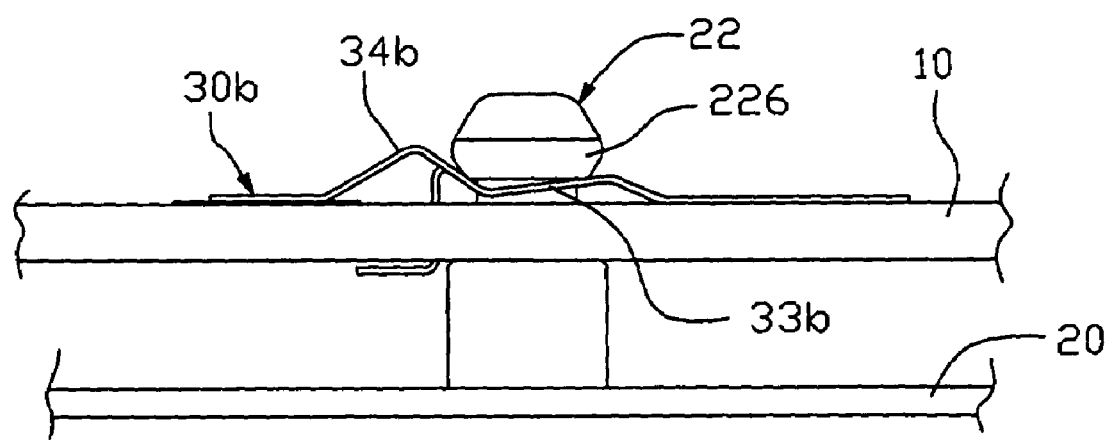
FIG. 8 is similar to FIG. 7, but the clip of FIG. 1 being replaced by the clip of FIG. 6.

Clips 30a, 30b provided in FIGS. 5 and 6 are other alternative embodiments of clip 30 of the present invention. A resilient portion 34a, 34b of the clip 30a, 30b has a substantially wave-shaped structure. A level plane 33a is formed on the clip 30a wherein a securing opening 354a is disposed. Similarly, a bevel plane 33b is formed on the clip 30b wherein a securing opening 354b is disposed. Referring to FIGS. 7 and 8, when the PCB 10 is mounted, the head portion 226 of the standoff 22 is positioned on the level plane 33a or the bevel plane 33b. A friction between the head portion 226 and the clip 30a, 30b is greater than a friction between the head portion 226 and the clip 30. The PCB 10 is thus mounted more stably by the clips 30a, 30b than by the clip 30.

Furthermore, the protrusions 382 of the clip 30, 30a, 30b of the extending portion 38 touch the ground pad 18 of the PCB 10, and the clip 30, 30a, 30b electrically contacts with the standoff 22. The PCB 10 thus has an effective grounding through the standoff 22 and the clip 30, 30a, 30b.

It is to be understood, however, that even though numerous characteristics and advantages have been set forth in the foregoing description of preferred embodiments, together with details of the structure and function, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. An electronic device comprising:
a printed circuit board (PCB) defining a plurality of through holes therein;
a chassis comprising a supporting board, the supporting board having a plurality of standoffs corresponding to the through holes of the PCB; and
a plurality of clips mounted on the PCB, each of the clips comprising a deformable portion for engaging with the standoff;
wherein the standoffs are inserted into the corresponding through holes of the PCB and slide in the corresponding through holes relative to the clips in a first direction to press and resiliently deform the deformable portions of the corresponding clips along a direction towards the PCB, engagement between the standoffs and the deformable portions of the corresponding clips prevents the standoffs from sliding in a second direction reverse to the first direction;
wherein a mounting opening is defined in each of the clips and extends into the deformable portion thereof, and comprises a guiding opening for having the standoff passing through and a securing opening for preventing the standoff disengaging from the deformable portion of the corresponding clip, an end of each of the standoffs passes through the guiding opening of each of the corresponding mounting openings, and presses and deforms the corresponding deformable portion of each of the corresponding clips toward the PCB when the standoffs slide into the corresponding securing openings thereof.

2. The electronic device as described in claim 1, wherein the deformable portion of the clip has a V-shaped structure.

3. The electronic device as described in claim 1, wherein the deformable portion of the clip has a wave-shaped structure.

4. The electronic device as described in claim 3, wherein a level plane is formed in the deformable portion of the clip for engaging with the standoff.

5. The electronic device as described in claim 3, wherein a bevel plane is formed in the deformable portion of the clip for engaging with the standoff.

6. The electronic device as described in claim 1, wherein each of the clips further comprises an extending portion bent from the deformable portion thereof and connecting with a ground pad disposed on the PCB.

7. An electronic device comprising:
a first substrate defining at least a through hole therein;
a second substrate having at least a standoff corresponding to the through hole in the first substrate; and
at least a clip being sandwiched between an end of the standoff and the first substrate, the clip having a resilient portion, wherein the resilient portion is pressed by the end of the standoff while the standoff slides in the through hole of the first substrate;
wherein the clip further comprises a mounting portion attached to the first substrate and an extending portion extendable along the first substrate;
wherein the resilient portion is between the mounting portion and the extending portion, and deformed toward the PCB to have the extending portion moving along the first substrate when the resilient portion is pressed by the end of the standoff.

8. The electronic device as described in claim 7, wherein at least a mounting opening corresponding to the through hole in the first substrate is defined in the clip and extends into the resilient portion.

* * * * *